(12) United States Patent
Talledo

(10) Patent No.: US 9,490,146 B2
(45) Date of Patent: Nov. 8, 2016

(54) SEMICONDUCTOR DEVICE WITH ENCAPSULATED LEAD FRAME CONTACT AREA AND RELATED METHODS

(71) Applicant: STMICROELECTRONICS, INC., Calamba, Laguna (PH)

(72) Inventor: Jefferson Talledo, Laguna (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 4 days.

(21) Appl. No.: 14/293,364

(22) Filed: Jun. 2, 2014

(65) Prior Publication Data

US 2015/0348879 A1   Dec. 3, 2015

(51) Int. Cl.

| H01L 23/495 | (2006.01) |
| H01L 21/48 | (2006.01) |
| H01L 21/56 | (2006.01) |
| H01L 23/31 | (2006.01) |
| H01L 23/00 | (2006.01) |

(52) U.S. Cl.
CPC ....... *H01L 21/4825* (2013.01); *H01L 23/4952* (2013.01); *H01L 23/49517* (2013.01); *H01L 23/49537* (2013.01); *H01L 23/49541* (2013.01); *H01L 23/3107* (2013.01); *H01L 24/32* (2013.01); *H01L 24/48* (2013.01); *H01L 24/83* (2013.01); *H01L 24/85* (2013.01); *H01L 2224/32245* (2013.01); *H01L 2224/48091* (2013.01); *H01L 2224/48245* (2013.01); *H01L 2224/73265* (2013.01); *H01L 2224/8385* (2013.01); *H01L 2224/83424* (2013.01); *H01L 2224/83447* (2013.01); *H01L 2224/85424* (2013.01); *H01L 2224/85447* (2013.01); *H01L 2224/92247* (2013.01); *H01L 2924/00014* (2013.01); *H01L 2924/01013* (2013.01); *H01L 2924/01029* (2013.01); *H01L 2924/14* (2013.01); *H01L 2924/181* (2013.01)

(58) Field of Classification Search
CPC ................ H01L 23/49555; H01L 23/495441; H01L 23/49544; H01L 23/49565; H01L 23/49541; H01L 23/49548; H01L 23/49551
See application file for complete search history.

(56) References Cited

U.S. PATENT DOCUMENTS

| 3,320,658 | A | * | 5/1967 | Bolda ...................... B23K 3/06 174/84 R |
| 4,716,272 | A | * | 12/1987 | Blad ..................... B23K 1/0008 219/129 |
| 5,072,283 | A | | 12/1991 | Bolger |
| 5,144,412 | A | * | 9/1992 | Chang ................... H01L 21/486 257/665 |
| 6,169,323 | B1 | * | 1/2001 | Sakamoto ............... H01L 23/31 257/667 |
| 6,544,813 | B1 | | 4/2003 | Lin |
| 6,627,824 | B1 | | 9/2003 | Lin |
| 6,706,971 | B2 | | 3/2004 | Albert et al. |
| 8,421,241 | B2 | * | 4/2013 | Meghro ............ H01L 23/49517 257/666 |
| 2002/0100600 | A1 | | 8/2002 | Albert et al. |
| 2002/0126459 | A1 | | 9/2002 | Albert et al. |

(Continued)

*Primary Examiner* — Mark Tornow
*Assistant Examiner* — Abbigale Boyle
(74) *Attorney, Agent, or Firm* — Allen, Dyer, Doppelt, Milbrath & Gilchrist, P.A.

(57) ABSTRACT

A semiconductor device may include an IC, and lead frame contact areas adjacent the IC. Each lead frame contact area may have a lead opening. The semiconductor device may include bond wires, each bond wire coupling a respective lead frame contact area with the IC. The semiconductor device may include encapsulation material surrounding the IC, the lead frame contact areas, and the bond wires, and leads. Each lead may extend through a respective lead opening and outwardly from the encapsulation material.

23 Claims, 4 Drawing Sheets

(56) References Cited

U.S. PATENT DOCUMENTS

| | | | |
|---|---|---|---|
| 2006/0012055 A1* | 1/2006 | Foong | H01L 24/13 257/780 |
| 2007/0051777 A1* | 3/2007 | Yamaguchi | B23K 3/0653 228/101 |
| 2007/0099348 A1* | 5/2007 | Sharma | H01L 23/4951 438/123 |
| 2007/0199926 A1* | 8/2007 | Watanabe | H01R 43/0221 219/121.64 |
| 2011/0065240 A1 | 3/2011 | Gao et al. | |
| 2012/0199960 A1* | 8/2012 | Cosue | H01L 24/85 257/668 |
| 2013/0134210 A1* | 5/2013 | Muto | H01L 23/49513 228/249 |

* cited by examiner

SEMICONDUCTOR DEVICE WITH ENCAPSULATED LEAD FRAME CONTACT AREA AND RELATED METHODS

TECHNICAL FIELD

The present disclosure relates to the field of electronic devices, and, more particularly, to semiconductor devices and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via wire bonds or solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Some IC packages may provide less than desirable reliability when subjected to high stress environments. For example, the IC package mounted onto a PCB may be subjected to vibrations, shocks and PCB bending that would result in the breaking of solder joint connection between the IC package and the PCB. Some approaches to IC packages, such as QFN, may not be functional after being subjected to continuous vibration and/or shock.

SUMMARY

Generally speaking, a semiconductor device may include at least one IC, and a plurality of lead frame contact areas adjacent the at least one IC. Each lead frame contact area may have a lead opening therein. The semiconductor device may include a plurality of bond wires. Each bond wire may couple a respective lead frame contact area with the at least one IC. The semiconductor device may include encapsulation material surrounding the at least one IC, the plurality of lead frame contact areas, and the plurality of bond wires, and a plurality of leads. Each lead may extend through a respective lead opening and outwardly from the encapsulation material.

In particular, semiconductor device may further include a plurality of solder joints, each solder joint attaching a respective lead within a corresponding lead opening. Each of the lead openings may comprise a lead through-opening extending through a corresponding lead frame contact area, and each of the solder joints may fill a corresponding lead through-opening. Each of the solder joints may be laterally spaced outwardly from a respective bond wire. Each of the solder joints may be a ball shape, for example.

In some embodiments, the semiconductor device may further comprise at least one IC die pad below the at least one IC. The semiconductor device may also comprise an adhesive layer between the at least one IC and the at least one IC die pad. For example, each lead frame contact area may have a rectangular shape. The plurality of lead frame contact areas and the plurality of leads may comprise copper.

Another aspect is directed to an electronic device. The electronic device may include a semiconductor device, and a printed circuit board (PCB) carrying the semiconductor device. The semiconductor device may include at least one IC, and a plurality of lead frame contact areas adjacent the at least one IC. Each lead frame contact area may have a lead opening therein. The semiconductor device may include a plurality of bond wires, each bond wire coupling a respective lead frame contact area with the at least one IC, and encapsulation material surrounding the at least one IC, the plurality of lead frame contact areas, and the plurality of bond wires. The semiconductor device may include a plurality of leads, each lead extending through a respective lead opening and outwardly from the encapsulation material.

Another aspect is directed to a method for making a semiconductor device. The method may include forming a plurality of lead frame contact areas adjacent at least one IC, each lead frame contact area having a lead opening therein, and coupling a respective bond wire between each lead frame contact area and the at least one IC. The method may include surrounding the at least one IC, the plurality of lead frame contact areas, and the plurality of bond wires with an encapsulation material, and coupling each of a plurality of leads to extend through a respective lead opening and outwardly from the encapsulation material.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
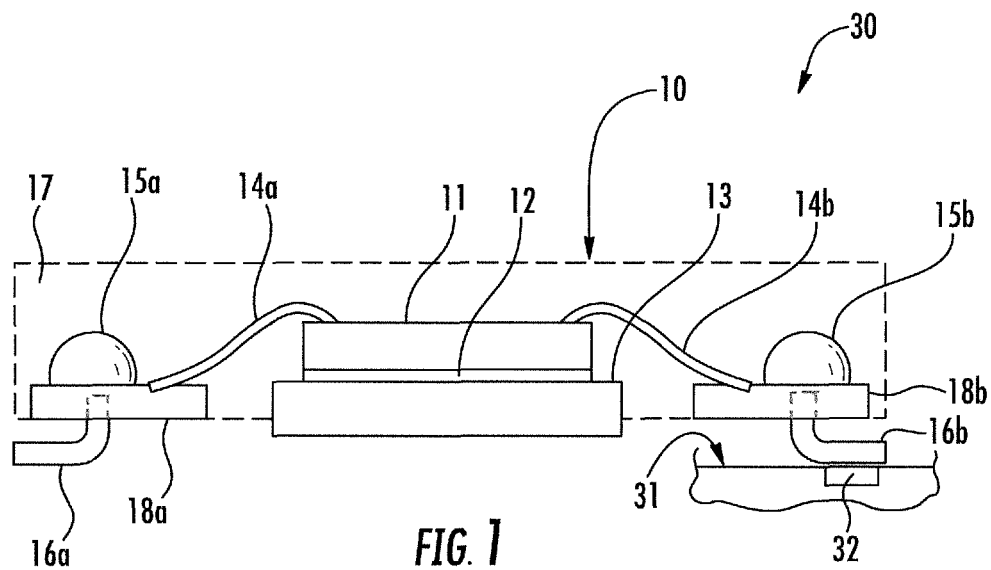
FIG. 1 is a schematic diagram of a cross-sectional view of an electronic device, according to the present disclosure.
Figure 2:
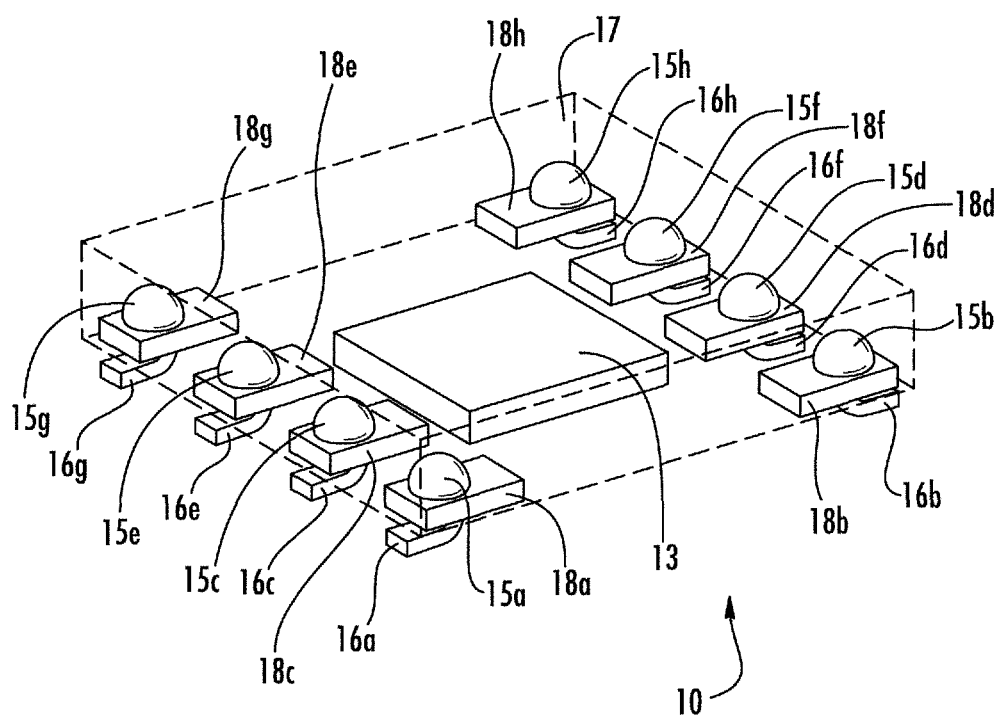
FIG. 2 is a schematic diagram of a perspective view of the semiconductor device of FIG. 1, without the bond wires, the IC, and the adhesive layer, according to the present disclosure.
Figure 3:
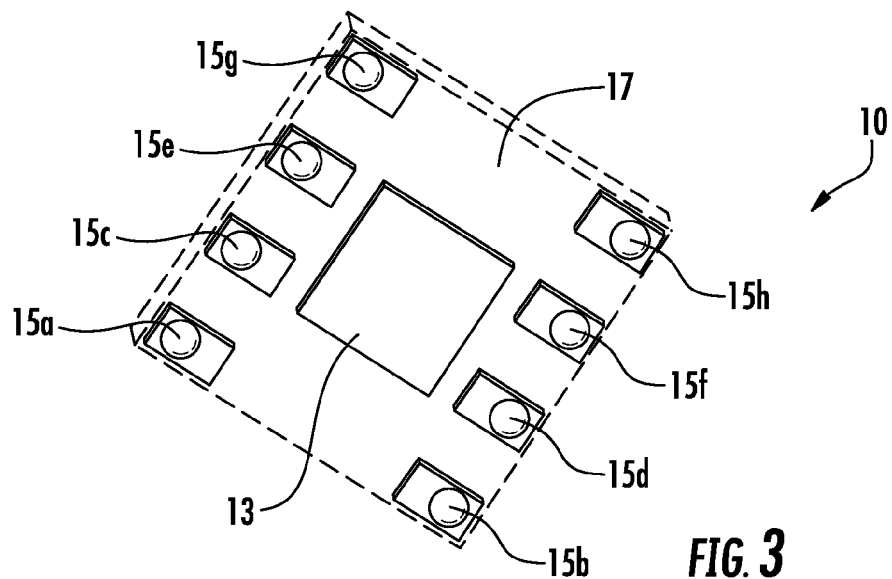
FIG. 3 is a schematic diagram of another perspective view of the semiconductor device of FIG. 1, without the leads, according to the present disclosure.

Referring initially to FIGS. 1-3, an electronic device 30 according to the present disclosure is now described. The electronic device 30 illustratively includes a semiconductor device 10, and a PCB 31 carrying the semiconductor device. The semiconductor device 10 includes an IC 11, and a plurality of lead frame contact areas 18a-18h adjacent the IC. Each lead frame contact area 18a-18h may have a lead opening therein. The semiconductor device 10 illustratively includes a plurality of bond wires 14a-14b, each bond wire coupling a respective lead frame contact area 18a-18h with the IC 11.

The semiconductor device 10 also illustratively includes encapsulation material 17 surrounding the IC 11, the plurality of lead frame contact areas 18a-18h, and the plurality of bond wires 14a-14b. For example, the encapsulation material 17 may comprise an electrically insulating resin (i.e. dielectric material). The semiconductor device 10 also illustratively includes a plurality of leads 16a-16h, each lead extending through a respective lead opening and outwardly from the encapsulation material 17. The plurality of lead frame contact areas 18a-18h and the plurality of leads 16a-16h may comprise copper, aluminum, for example.

The leads 16a-16h are coupled (e.g. soldered) to the PCB 31 via contact pads 32. Advantageously, the leads 16a-16h are flexible and mechanically robust. Accordingly, when the PCB 31 is subjected to vibration, shock, and bending, there is a reduced risk of any break or crack occurring in the outside solder joint connection between the leads 16a-16h and the PCB 31.

In particular, the semiconductor device 10 illustratively includes a plurality of solder joints 15a-15h, each solder joint attaching a respective lead 16a-16h within a corresponding lead opening. Each of the lead openings may comprise a lead through-opening extending through a corresponding lead frame contact area 18a-18h. In other words, the lead openings may completely extend through the lead frame contact areas 18a-18h, thereby defining a passageway therethrough.

Each of the solder joints 15a-15h may fill a corresponding lead through-opening. Also, as in the illustrated embodiments, each of the solder joints 15a-15h may be laterally spaced outwardly from a respective bond wire 14a-14b. Each of the solder joints 15a-15h may be a ball shape, for example. Of course, in other embodiments, the solder joints 15a-15h may have other shapes and forms.

In the illustrated embodiment, the semiconductor device 10 includes an IC die pad 13 below the IC 11, and an adhesive layer 12 between the IC and the IC die pad. The IC die pad 13 may comprise copper or aluminum. For example, in the illustrated embodiment, each lead frame contact area 18a-18h has a rectangular shape.

Another aspect is directed to a semiconductor device 10. The semiconductor device 10 may include at least one IC 11, and a plurality of lead frame contact areas 18a-18h adjacent the at least one IC. Each lead frame contact area 18a-18h may have a lead opening therein. The semiconductor device 10 may include a plurality of bond wires 14a-14b, each bond wire coupling a respective lead frame contact area 18a-18h with the at least one IC 11, and encapsulation material 17 surrounding the at least one IC, the plurality of lead frame contact areas, and the plurality of bond wires, and a plurality of leads 16a-16h, each lead extending through a respective lead opening and outwardly from the encapsulation material.

Another aspect is directed to a method for making a semiconductor device 10. The method may include forming a plurality of lead frame contact areas 18a-18h adjacent at least one IC 11, each lead frame contact area having a lead opening therein, coupling a respective bond wire 14a-14b between each lead frame contact area and the at least one IC, surrounding the at least one IC, the plurality of lead frame contact areas, and the plurality of bond wires with an encapsulation material 17, and coupling each of a plurality of leads 16a-16h to extend through a respective lead opening and outwardly from the encapsulation material.

Figure 4:
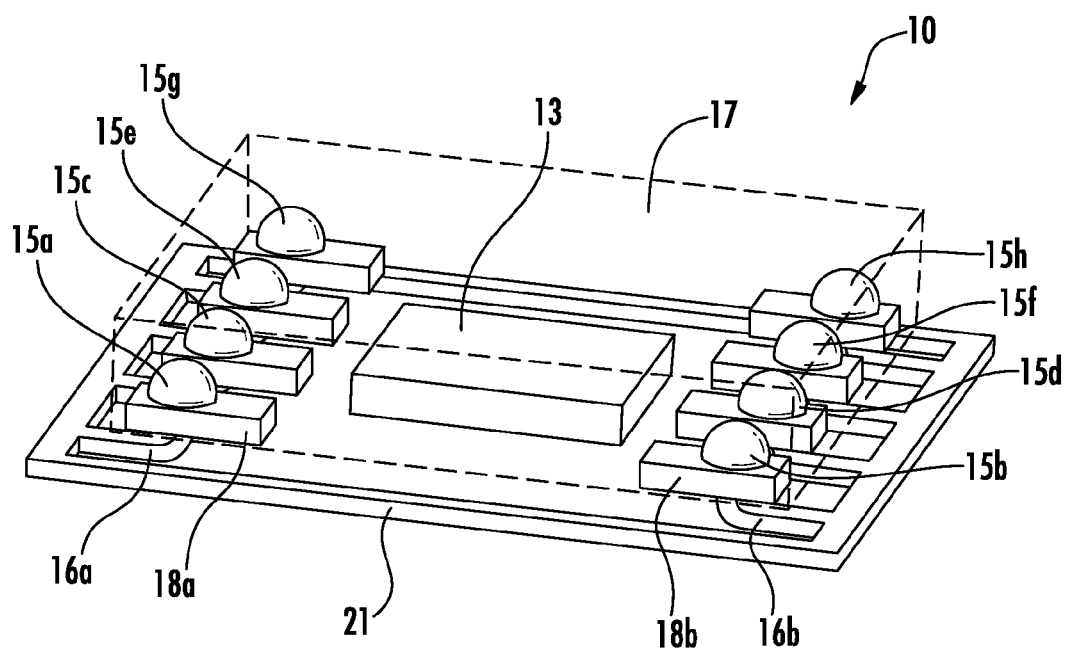
FIG. 4 is a schematic diagram of yet another perspective view of the semiconductor device of FIG. 1, before lead cutting/trimming, without the bond wires, the IC, and the adhesive layer, according to the present disclosure.
Figure 5:
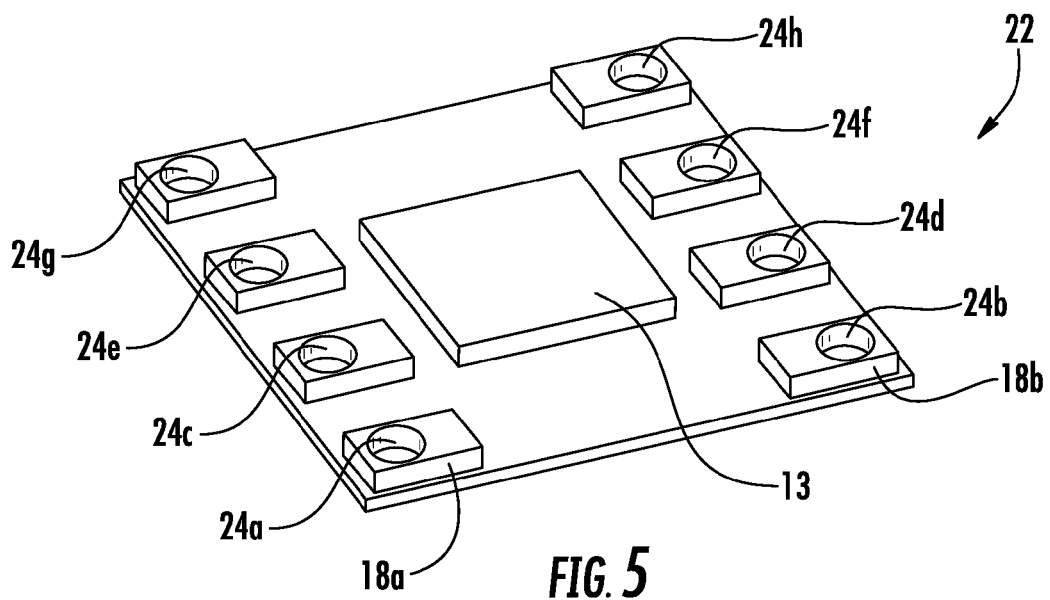
FIG. 5 is a schematic diagram of a perspective view of a step for making a semiconductor device, according to the present disclosure.
Figure 6:
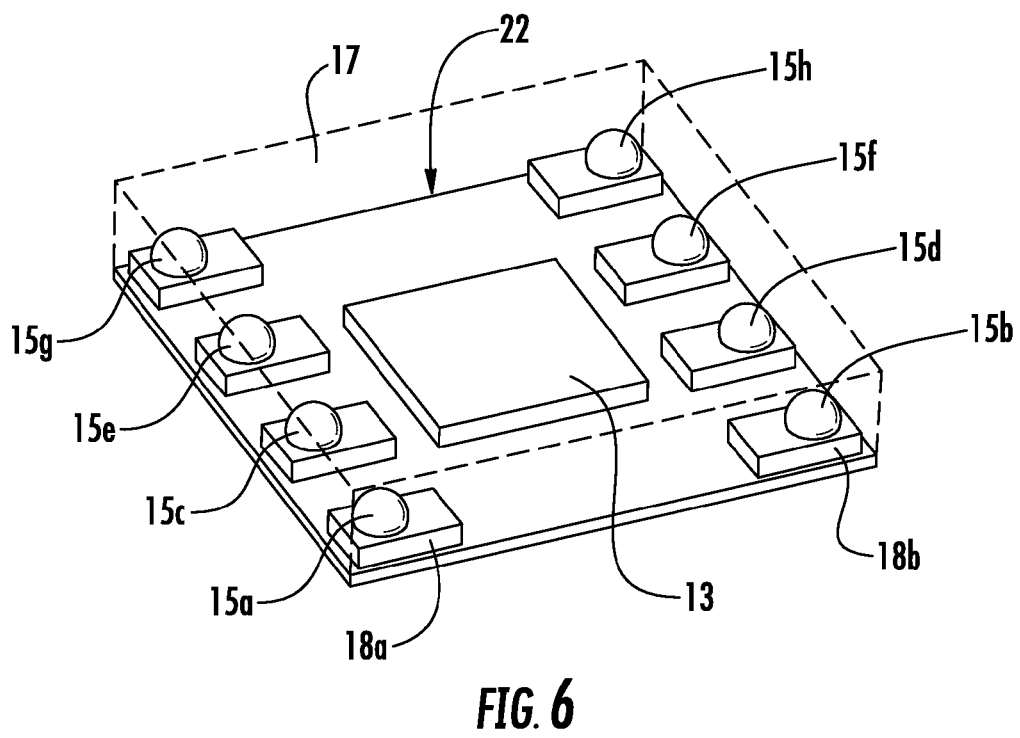
FIG. 6 is a schematic diagram of a perspective view of a step for making a semiconductor device, without the bond wires, the IC, and the adhesive layer, according to the present disclosure.

Referring now additionally to FIGS. 4-8, a method for making the semiconductor device 10 is now described. In FIG. 5, a lead frame 22 is formed, the lead frame comprising a top lead frame component defining a plurality of recesses 24a-24h and a bottom lead frame component. The plurality of recesses 24a-24h may each have a hemisphere shape. In other embodiments, the plurality of recesses 24a-24h may each have a rectangular box shape. The top lead frame component of the lead frame 22 illustratively includes the IC die pad 13, and the plurality of lead frame contact areas 18a-18h. Each of the lead frame contact areas 18a-18h defines the recess 24a-24h. The recesses 24a-24h may be formed via a half etch isotropic process. In FIG. 6, the solder joints 15a-15h are formed respectively in the recesses 24a-24h.

Figure 7:
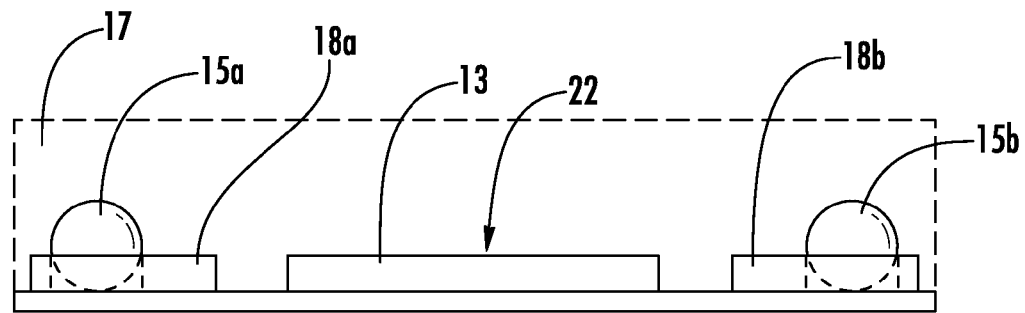
FIG. 7 is a schematic diagram of a side view of a step for making a semiconductor device, without the bond wires, the IC, and the adhesive layer, according to the present disclosure.
Figure 8:
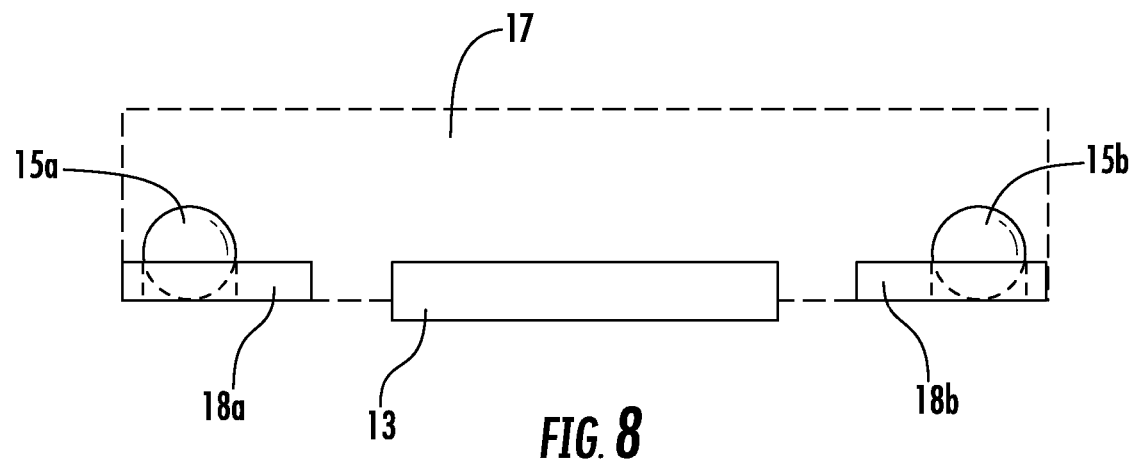
FIG. 8 is a schematic diagram of a side view of a step for making a semiconductor device, without the bond wires, the IC, and the adhesive layer, according to the present disclosure.

The method includes positioning the IC 11 on the top lead frame component, and forming a plurality of wire bonds 14a-14b between the IC and the solder joints 15a-15h. In FIGS. 6-7, the encapsulation material 17 is formed on the lead frame 22. In FIG. 8, the lead frame 22 is etched to remove a bottom portion thereof.

As perhaps best seen in FIG. 4, once the solder joints 15a-15h are formed, the flexible lead frame 21 is positioned so that each lead 16a-16h is aligned with the respective solder joint. The method then includes a solder reflow process to couple the flexible lead frame 21 and leads 16a-16h and the solder joints 15a-15h. The flexible lead frame 21 is cut to remove the bottom portion, and the package may be singulated.

Advantageously, the semiconductor device 10 provides a tapeless lead frame IC package having bottom compliant leads to absorb shock, vibration, and PCB bending, and provide improved board level reliability (BLR). In comparison to typical small outline packaged (SOP) devices, the semiconductor device 10 can have internal rows of compliant leads (applied to QFN multi-row), unlike SOP, which only has side leads. Moreover, with the disclosed process for making the semiconductor device 10, the molding process for tapeless QFN can be used. In comparison to typical tapeless QFN devices, the semiconductor device 10 can provide leads that are compliant and expected to perform better than tapeless QFN and even tape QFN in terms of BLR and lead robustness under shock, vibration and PCB/board bending.

More generally, the semiconductor device 10 provides an approach to several problems affecting the prior art devices. Prior art devices may be subject to lead/solder joint failure when subjected to shock, vibration and PCB bending. Moreover, the semiconductor device 10 may provide an approach to improving Board Level Reliability (BLR) for typical approaches that include a package soldered on PCB and subjected to bending or thermal cycling, the non-compliant leads having lower BLR performance.

Many modifications and other embodiments of the present disclosure will come to the mind of one skilled in the art having the benefit of the teachings presented in the forego- That which is claimed is:
1. A semiconductor device comprising:
at least one integrated circuit (IC);
a plurality of lead frame contact pads adjacent said at least one IC, each lead frame contact pad having a lead opening therein;
a plurality of bond wires, each bond wire coupling a respective lead frame contact pad with said at least one IC;
encapsulation material surrounding said at least one IC, said plurality of lead frame contact pads, and said plurality of bond wires, said encapsulation material extending over the lead openings of said plurality of lead frame contact pads; and
a plurality of curved leads, each curved lead extending through a respective lead opening and outwardly from said encapsulation material, each curved lead extending laterally outward toward a sidewall of said encapsulation material and defining a gap with said encapsulation material.

2. The semiconductor device of claim 1 further comprising a plurality of solder joints, each solder joint attaching a respective curved lead within a corresponding lead opening.

3. The semiconductor device of claim 2 wherein each of said lead openings comprises a lead through-opening extending through a corresponding lead frame contact pad; and wherein each of said plurality of solder joints fills a corresponding lead through-opening.

4. The semiconductor device of claim 2 wherein each of said plurality of solder joints is laterally spaced outwardly from a respective bond wire.

5. The semiconductor device of claim 2 wherein each of said plurality of solder joints has a ball shape.

6. The semiconductor device of claim 1 further comprising at least one IC die pad below said at least one IC.

7. The semiconductor device of claim 6 further comprising an adhesive layer between said at least one IC and said at least one IC die pad.

8. The semiconductor device of claim 1 wherein each lead frame contact pad has a rectangular shape.

9. The semiconductor device of claim 1 wherein said plurality of lead frame contact pads and said plurality of curved leads comprise copper.

10. An electronic device comprising:
a semiconductor device comprising
at least one integrated circuit (IC),
a plurality of lead frame contact pads adjacent said at least one IC, each lead frame contact pad having a lead opening therein,
a plurality of bond wires, each bond wire coupling a respective lead frame contact pad with said at least one IC,
encapsulation material surrounding said at least one IC, said plurality of lead frame contact pads, and said plurality of bond wires, said encapsulation material extending over the lead openings of said plurality of lead frame contact pads, and
a plurality of curved leads, each curved lead extending through a respective lead opening and outwardly from said encapsulation material, each curved lead extending laterally outward toward a sidewall of said encapsulation material and defining a gap with said encapsulation material; and
a printed circuit board carrying said semiconductor device.

11. The electronic device of claim 10 wherein said semiconductor device comprises a plurality of solder joints, each solder joint attaching a respective curved lead within a corresponding lead opening.

12. The electronic device of claim 11 wherein each of said lead openings comprises a lead through-opening extending through a corresponding lead frame contact pad; and wherein each of said plurality of solder joints fills a corresponding lead through-opening.

13. The electronic device of claim 11 wherein each of said plurality of solder joints is laterally spaced outwardly from a respective bond wire.

14. The electronic device of claim 10 wherein said semiconductor device comprises at least one IC die pad below said at least one IC.

15. A method for making a semiconductor device comprising:
forming a plurality of lead frame contact pads adjacent at least one integrated circuit (IC), each lead frame contact pad having a lead opening therein;
coupling a respective bond wire between each lead frame contact pad and the at least one IC;
surrounding the at least one IC, the plurality of lead frame contact pads, and the plurality of bond wires with an encapsulation material, the encapsulation material extending over the lead openings of the plurality of lead frame contact pads; and
coupling each of a plurality of curved leads to extend through a respective lead opening and outwardly from the encapsulation material, each curved lead extending laterally outward toward a sidewall of the encapsulation material and defining a gap with the encapsulation material.

16. The method of claim 15 further comprising forming a plurality of solder joints, each solder joint attaching a respective curved lead within a corresponding lead opening.

17. The method of claim 16 wherein each of the lead openings comprises a lead through-opening extending through a corresponding lead frame contact pad; and wherein each of the plurality of solder joints fills a corresponding lead through-opening.

18. The method of claim 16 wherein each of the plurality of solder joints is laterally spaced outwardly from a respective bond wire.

19. The method of claim 16 wherein each of the solder joints has a ball shape.

20. The method of claim 15 further comprising forming at least one IC die pad below the at least one IC.

21. A semiconductor device comprising:
at least one integrated circuit (IC);
a plurality of lead frame contact pads adjacent said at least one IC, each lead frame contact pad having a lead opening therein, each lead frame contact pad having a rectangular shape;
a plurality of bond wires, each bond wire coupling a respective lead frame contact pad with said at least one IC;
encapsulation material surrounding said at least one IC, said plurality of lead frame contact pads, and said plurality of bond wires, said encapsulation material extending over the lead openings of said plurality of lead frame contact pads;

a plurality of curved leads, each curved lead extending through a respective lead opening and outwardly from said encapsulation material, each curved lead extending laterally outward toward a sidewall of said encapsulation material and defining a gap with said encapsulation material; and at least one IC die pad being below said at least one IC.

22. The semiconductor device of claim 21 further comprising a plurality of solder joints, each solder joint attaching a respective curved lead within a corresponding lead opening.

23. The semiconductor device of claim 22 wherein each of said lead openings comprises a lead through-opening extending through a corresponding lead frame contact pad; and wherein each of said plurality of solder joints fills a corresponding lead through-opening.

* * * * *